US005793248A

United States Patent [19]

Lee et al.

[11] Patent Number: 5,793,248

[45] Date of Patent: Aug. 11, 1998

[54] VOLTAGE CONTROLLED VARIABLE CURRENT REFERENCE

[75] Inventors: Lan Lee; Saleel Awsare, both of San Francisco, Calif.

[73] Assignee: Exel Microelectronics, Inc., San Jose, Calif.

[21] Appl. No.: 690,008

[22] Filed: Jul. 31, 1996

[51] Int. Cl.[6] .................. H03K 3/01

[52] U.S. Cl. .................. 327/543; 327/308; 327/404; 323/315; 323/317; 326/87

[58] Field of Search .................. 327/108–112, 308, 327/403, 404, 427, 434, 538, 543; 323/312, 315, 316, 317; 326/87

[56] References Cited

U.S. PATENT DOCUMENTS 4,864,162 9/1989 Maoz .................. 327/308
5,457,407 10/1995 Shu et al. .................. 326/87
5,583,464 12/1996 Knight, Jr. et al. .................. 327/308

*Primary Examiner*—Kenneth B. Wells
*Attorney, Agent, or Firm*—Limbach & Limbach LLP

[57] ABSTRACT

A current source providing a voltage-controlled variable-current reference is described which employs a conventional current mirror to supply a current to a diode-connected transistor, and to a plurality of controllable current paths, wherein the controllable current paths are controlled by voltages from a voltage sensing circuit so that predetermined amounts of current are drawn away from the diode-connected transistor as function of a controlled voltage, so that the diode-connected transistor generates a voltage as a function of the current flowing through it which voltage is used to control an output transistor and a current flowing through the output transistor.

18 Claims, 4 Drawing Sheets

VOLTAGE CONTROLLED VARIABLE CURRENT REFERENCE

TECHNICAL FIELD

The present invention is directed generally to current sources, and more particularly to a voltage controlled variable current reference circuit.

BACKGROUND ART

Typical of current sources in the prior art is the current mirror in which a reference current is forced to flow through a diode-connected bipolar or MOS transistor and the voltage induced across the base-emitter or gate-source of the transistor is then applied to the base-emitter or gate-source of a second, similarly constructed, transistor. This, in turn, produces a current through the second transistor which is related to the current flowing through the first transistor. Typically, as the supply voltage to the current mirror is varied from the full supply voltage toward zero volts, the magnitude of the current flowing out of the current mirror is reduced. Such a typical current mirror is shown in FIG. 1A with the variation in current as a function of the supply voltage shown in FIG. 1B.

In certain applications it is desirable to have a current source which provides a stable current despite variations in the supply voltage. In other applications it is desirable for a current source to have an output current which can be controlled in a predictable manner to change as a function of changing supply voltage. Further, it is sometimes desirable to have a current source in which the output current can be increased or decreased as a function of a reference voltage applied to the current source.

SUMMARY OF THE INVENTION

The present invention provides a stable current source which can operate over a wide supply voltage range, and which can increase or decrease current as a function of the supply voltage or a user supplied reference voltage. In accordance with the present invention, a current source is provided which is powered from a supply voltage and includes a source of current that provides a predetermined amount of current. A first semiconductor device is coupled to receive current from the source of current and provides an output voltage which has a selected relationship to the magnitude of current received from the source of current. A plurality of controllable current paths are connected to receive the current from the output from the source of current, and each of the plurality of controllable current paths is constructed to accommodate a selected amount of current when activated. A voltage sensing circuit is coupled to receive a control voltage and activates ones of the controllable current paths as a function of changes in the magnitude of the control voltage. A second semiconductor device is coupled to receive the output voltage from the first semiconductor device and provides an output current having a selected relationship to the magnitude of output voltage received from the first device. In this manner, as different numbers of controllable current paths are activated by the voltage sensing circuit, more or less current is drawn away from the first semiconductor device and thereby affects the amount of current which flows into the first semiconductor device. This results in a change in output voltage developed by the first semiconductor device and applied to the second semiconductor device. In turn, the output current supplied by the second semiconductor device will change as a function of the change in output voltage it receives from the first device.

In various embodiments of the present invention, the voltage sensing circuit can be coupled to the supply voltage, or to a reference voltage supplied by the user. Alternatively, two voltage sensing circuits can be used, one coupled to the supply voltage, and the other coupled to receive a control or reference voltage from the user.

It is therefore an object of the present invention to provide a current source which provides an output current controllable by a selected source of voltage.

It is a further object of the present invention to provide a voltage-controlled variable-current source in which the magnitude of output current is controllable by varying the magnitude of an applied control voltage.

These and other objectives, features, and advantages of the present invention will be more readily understood upon considering the following detailed description and accompanying drawings.

DETAILED DESCRIPTION

Figure 1A:
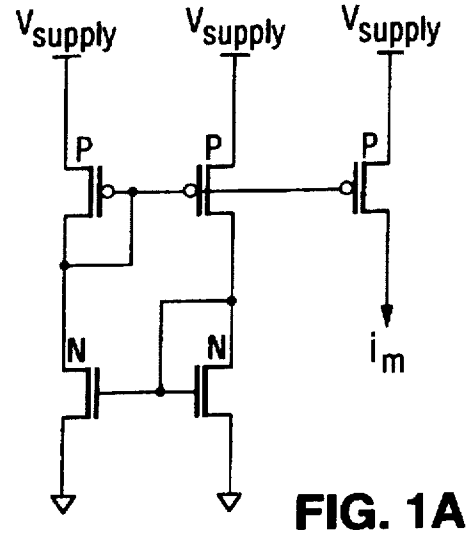
FIG. 1A (PRIOR ART)
FIG. 1A is a simplified schematic diagram of a conventional current mirror.
Figure 1B:
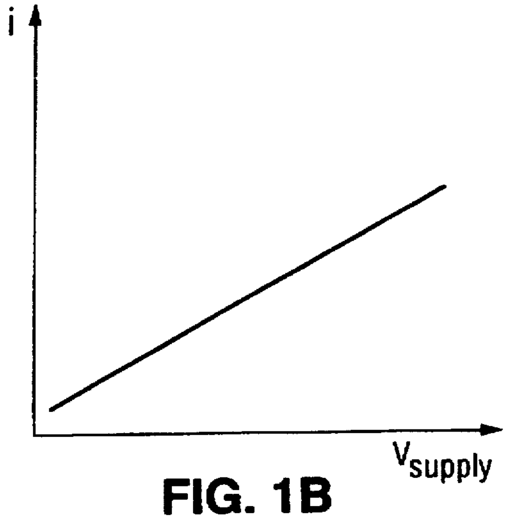
FIG. 1B (PRIOR ART)
FIG. 1B is a plot of the variation of current provided by the current mirror of FIG. 1A as a function of the supply voltage.
Figure 2:
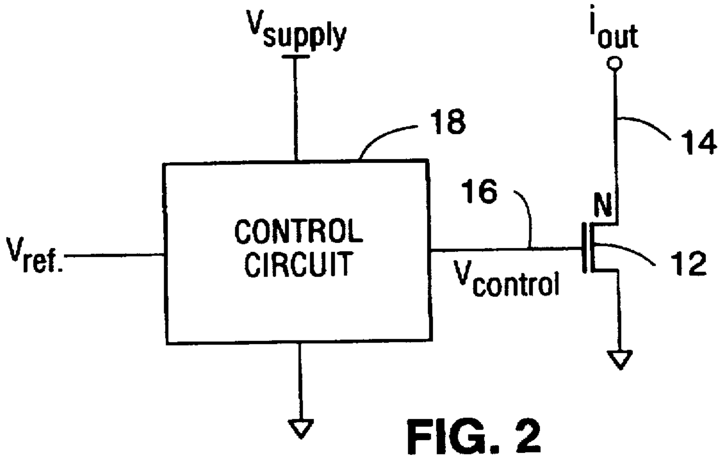
FIG. 2 is a high-level functional block diagram of one embodiment of the present invention.

Referring to FIG. 2, the present invention will be described at a conceptual level. Generally, the present invention includes an output device 12 which provides an output current at an output terminal 14 as a function of a control voltage supplied to a control terminal 16. In a preferred embodiment of the present invention, output device 12 is an MOS transistor.

The control circuit 18 which provides the control voltage to output device 12 is powered from the supply voltage, $V_{supply}$, and can also be controlled by a reference voltage $V_{ref}$. In accordance with the present invention, the control voltage, $V_{control}$, supplied from control circuit 18 varies in a predetermined manner as $V_{supply}$ and $V_{ref}$ vary.

Figure 3:
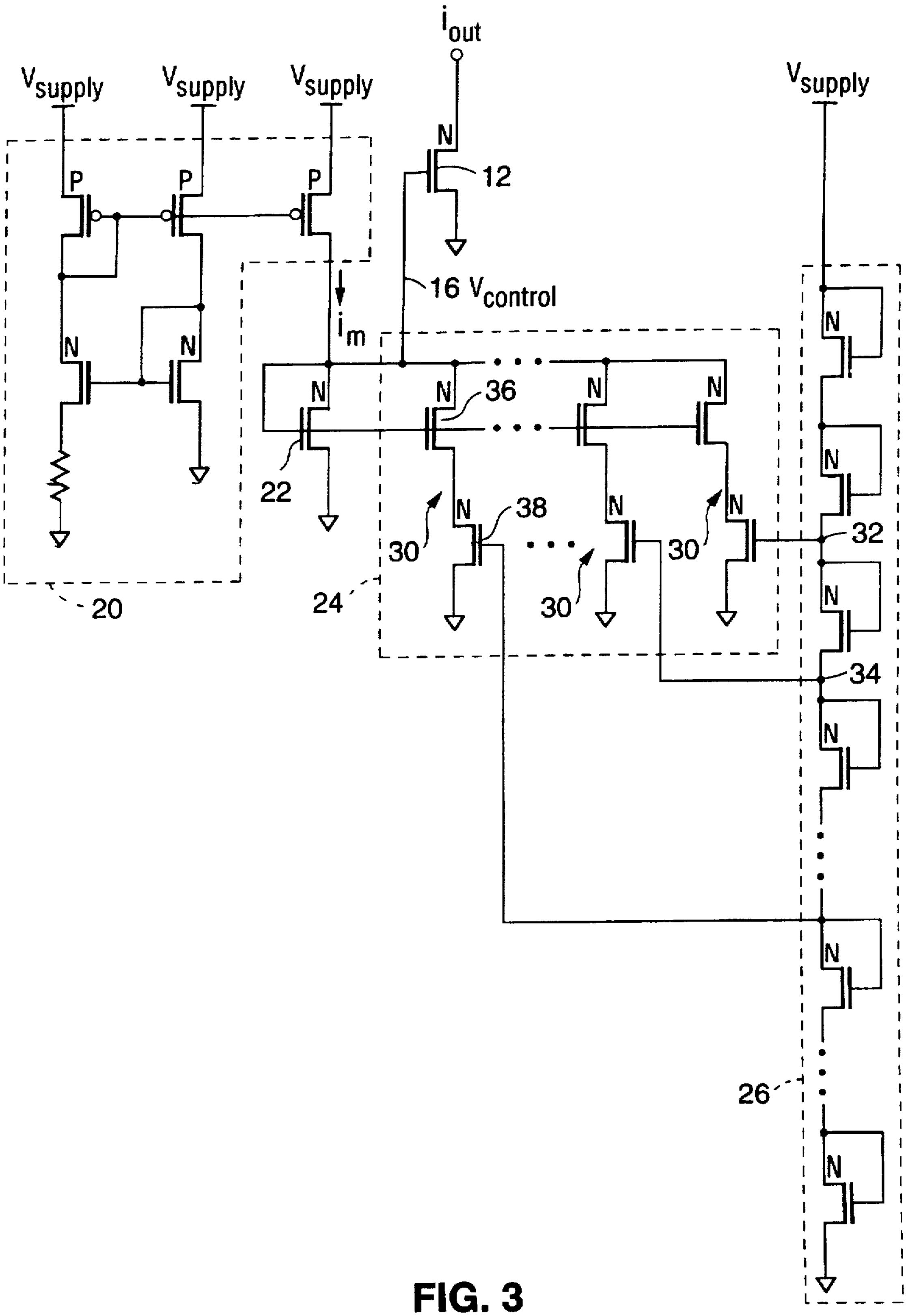
FIG. 3 is a simplified schematic diagram of an embodiment of the present invention in which the output current is controlled as a function of the supply voltage.

Referring now to FIG. 3, a more detailed description of one embodiment of control circuitry 18 will be provided. In the embodiment of FIG. 3, control circuit 18 includes a conventional current mirror 20, which supplies current to a diode-connected transistor 22. Connected to the diode-connected transistor 22 are a set of controllable current paths 24. Each of these controllable current paths is controlled by voltages supplied from a voltage sensing circuit 26.

In FIG. 3, current $i_m$, from current mirror 20, is caused to flow into diode-connected transistor 22. This induces a voltage on line 16 which is applied to the control gate of transistor 12 to control the output current $i_{out}$ flowing through transistor 12. The set of selectable current paths 24, when activated, draw current from current mirror 20 and away from diode-connected transistor 22. This reduces the voltage level on line 16, which in turn reduces the control voltage applied to transistor 12, and therefore reduces the output current $i_{our}$.

Each of the current paths in the set of current paths 24 is controlled by a voltage from the voltage sensing circuit 26. More particularly, voltage sensing circuit 26 is formed of a ladder of diode-connected transistors. It is to be noted that each of the controllable current paths 30 is connected to a different node on the ladder, so that each of the paths will be activated depending upon the magnitude of the supply voltage applied at the top of the ladder. For example, the controllable current path controlled by the voltage at node 32 will be activated when $V_{supply}$ is 3 thresholds, $V_T$, above ground. In turn, the controllable current path 30 which is controlled from node 34 of voltage sensing circuit 26 will be activated when $V_{supply}$ is 4 thresholds voltages above ground. It is to be understood that by connecting the controllable current paths to different points in the ladder of voltage sensing circuit 26, the amount of current drawn away from diode-connected transistor 22 can be controlled as a function of the magnitude of supply voltage $V_{supply}$. It is further to be understood that the threshold voltages of the diode-connected transistors in the voltage sensing circuit 26 can be made to be different (for example by varying the physical size of the transistors) from the threshold voltages of the transistors in controllable paths 30 so that further variations in control can be obtained.

Turning now to the set 24 of controllable current paths 30, each of the controllable current paths 30 is preferably constructed of a pair of series connected transistors, each pair of which is connected in parallel with diode-connected transistor 22. One of the pair of transistors has its drain connected to the drain of diode-connected transistor 22 and its gate connected to the gate of the diode-connected transistor 22. The second transistor has its drain connected to the source of the first transistor, a source connected to ground, and a control gate which receives a corresponding control voltage from the voltage sensing circuit 26.

It is to be understood that the first transistor 36 can be sized to draw a predetermined amount of current from current mirror 20 as a function of the gate-source voltage induced across transistor 22. For example, for a given gate-source voltage across diode-connected transistor 22, transistor 36 can be sized to draw 1/10 of the current flowing through transistor 22 for the same gate-source voltage supplied across diode-connected transistor 22.

Thus, it can be appreciated that under such conditions if 10 controllable current paths are provided in a set of controllable current paths 24, the activation of all such paths will draw a substantial amount of current from a current mirror 20 and away from diode-connected transistor 22, and thereby cause the voltage $V_{control}$ at line 16, to be reduced substantially. In turn, it can be seen that as $V_{supply}$ drops, fewer of the controllable current paths will be activated, thereby increasing the amount of current permitted to flow from current mirror 20 into diode-connected transistor 22, thereby raising the magnitude of the voltage at line 16, and increasing the current flowing through transistor 12. In this manner, a decreasing supply voltage causes an increase in the output current flowing through transistor 12. Conversely, as $V_{supply}$ increases, a decreasing amount of current is permitted to flow into diode-connected transistor 22, thereby causing a decreasing magnitude of voltage being present at line 16. In turn, the magnitude of output current provided by transistor 12 decreases with increasing voltage supply.

Figure 4:
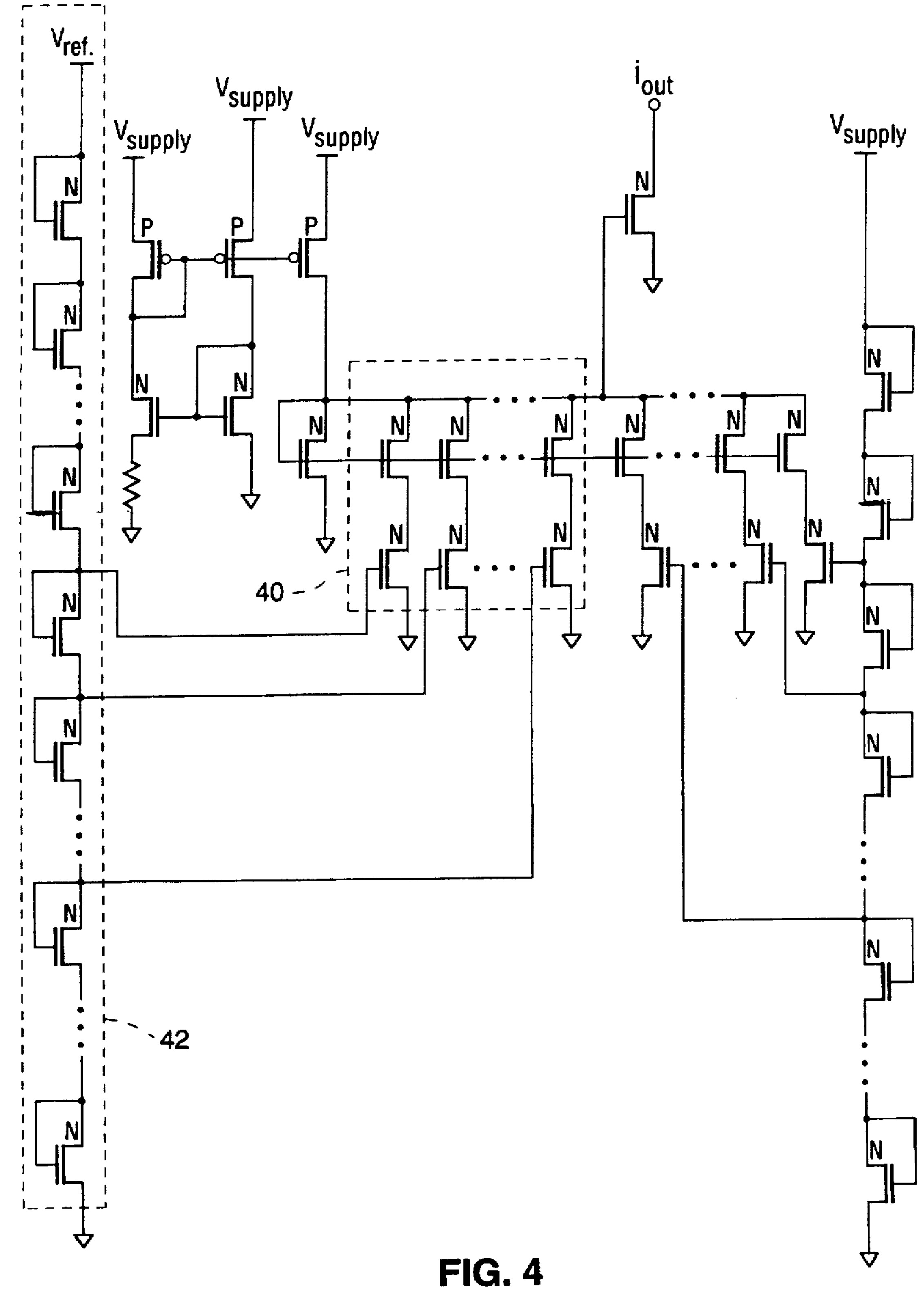
FIG. 4 is a simplified schematic diagram of a further embodiment of the present invention in which the output current is controlled as a function of the supply voltage as well a reference voltage.

Referring now to FIG. 4, the circuitry illustrated is similar to that in FIG. 3, except that a second set of controllable current paths 40, and a second voltage sensing circuit 42, have been added. The voltage sensing circuit 42 is constructed similarly to voltage sensing circuit 26, but is coupled to a reference voltage which can be supplied by the user. Further, it is to be noted that the control voltages are taken from different nodes of the voltage sensing circuit 42 when compared to that of sensing circuit 26. This means that a different magnitude of voltage at $V_{ref}$ will be required to activate different ones of the second set of controllable current paths 40.

In light of FIGS. 3 and 4, it can be appreciated that by the appropriate sizing of the transistors and the controllable current paths 30, and the selection of nodes in the voltage sensing circuit 26 from which to derive control voltages, the amount of current which is permitted to flow into diode-connected transistor 22 can be controlled as desired. For example, the transistors in controllable current paths 30 can be sized, and the control voltages from voltage sensing circuit 26 selected, to provide an output current which does not vary appreciable as the supply voltage level varies. More particularly, the controllable current paths would be controlled to draw less current as the magnitude of the voltage supply decreases, and the rate at which such decrease occurs is selected to offset the rate at which current mirror 20 decreases the magnitude of current $i_m$ with decreasing supply voltage. In this manner, the current flowing through diode-connected transistor 22 will remain substantially the same even though the supply voltage is decreasing.

Figure 5:
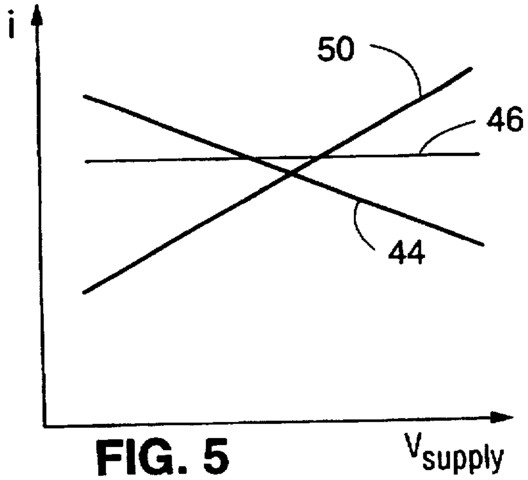
FIG. 5 is simplified plot of the different output current variations as a function of supply voltage which can be obtained in accordance with the present invention.

In situations where it is desired to have the output current actually increase as the supply voltage decreases, the transistor in the controllable current paths 20 (and the control voltage points from voltage sensing circuit 26) can be selected so that the amount of current which is permitted to flow into diode-connected transistor 22 is higher at low supply voltages than it is at higher supply voltages. Referring to FIG. 5, this latter condition is illustrated by graph 44. Similarly, the situation in which the current flow into diode-connected transistor 22 is kept constant over the supply variation, is illustrated in FIG. 5 by graph 46.

Figure 6:
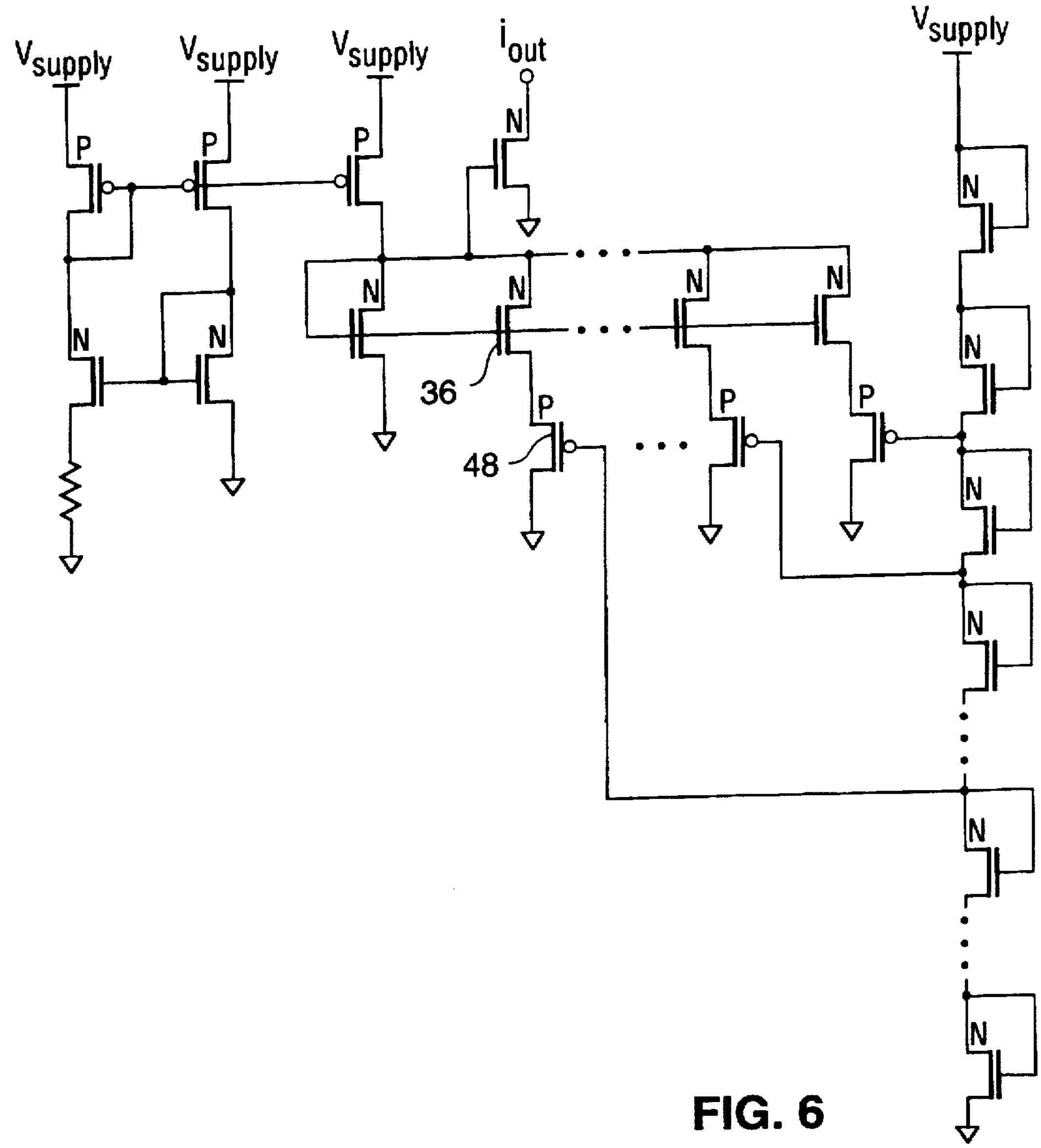
FIG. 6 is a still further embodiment of the present invention in which the output current can be controlled to increase as the supply voltage increases.

Referring now to FIG. 6, an embodiment of the present invention is shown in which the output current $i_{out}$ increases with increasing supply voltage. The difference between FIGS. 3 and 4 versus FIG. 6 is that in the controllable current paths of the former, N-channel transistors are used for both 36 and 38. In contrast, in the embodiment in FIG. 6, an N-channel transistor is used for transistor 36, but a P-channel transistor 48 is used in place of the N-channel transistor 38.

When $V_{supply}$ is low, all controllable current paths are on, but as the magnitude of $V_{supply}$ increases, the controllable current paths begin turning off. In this fashion, the current which is permitted to flow into diode-connected transistor 22 increases as the supply voltage increases. The output current to supply voltage relationship of FIG. 6 is shown as graph 50 in FIG. 5.

It is to be understood that while certain embodiments have been illustrated in the above Figures, there are numerous other variations of the present invention which can be constructed in the spirit of the present invention. While the examples describe have been given in terms of metal oxide semiconductor transistors, bipolar and other devices can be used.

The terms and expressions which have been employed here are used as terms of description and not of limitation, and there is no intention, in the use of such terms and expressions, of excluding equivalents of the features shown and described, or portions thereof, it being recognized that various modifications are possible within the scope of thei-nvention claimed.

What is claimed:

1. A current source providing an output current and powered from a supply voltage comprising an output device providing the output current at an output terminal and having a control terminal, wherein the magnitude of the output current is controlled as a function of a control voltage applied to the control terminal;

a control circuit coupled to the supply voltage and providing a control voltage to the control terminal of the output device which varies in a predetermined manner as a function of the magnitude of the supply voltage, wherein the control circuit includes a first semiconductor device which generates a voltage as a function of the magnitude of a current flowing through it, wherein the generated voltage is the control voltage provided by the control circuit; and a plurality of current paths which are activatable as a function of the magnitude of a designated voltage source and which modify the magnitude of current flowing through the first semiconductor device.

2. The current source of claim 1 wherein the output device is a field effect transistor.

3. The current source of claim 1 wherein the control circuit includes a source of current having an output coupled to the control terminal of the output device, and wherein the source of current provides a predetermined amount of current, and the first semiconductor device is coupled to receive current from the output of the source of current and is capable of producing a voltage at the output of the source of current having a selected relationship to the magnitude of current received from the source of current; and further wherein each of the plurality of current paths are connected to receive current from the output of the source of current, and are each constructed to accommodate a selected amount of current when activated; and further including a voltage sensing circuit coupled to the supply voltage and activating ones of the controllable current paths as a function of changes in magnitude of the supply voltage, wherein the supply voltage is the designated voltage source.

4. The current source of claim 1 wherein the source of current is a current mirror.

5. The current source of claim 1 wherein each of the plurality of controllable current paths includes field effect transistors.

6. The current source of claim 5 wherein the plurality of controllable current paths comprise a diode-connected metal oxide semiconductor transistor;

a second metal oxide semiconductor transistor connected in series with the diode-connected metal oxide semiconductor transistor, and having a control gate which is coupled to be controlled by the control circuit.

7. The current source of claim 1 wherein the voltage sensing circuit includes a plurality of diode-connected field effect transistors connected in series to form a ladder, with one end of the ladder coupled to the supply voltage; and further wherein junctions between ones of the diode-connected field effect transistors supply control voltages which control the plurality of controllable current paths.

8. A current source powered from a supply voltage comprising a source of current providing a predetermined amount of current;

a first semiconductor device coupled to receive current from the source of current and providing an output voltage having a selected relationship to the magnitude of current received from the source of current;

a plurality of controllable current paths connected to receive current from the output of the source of current, each of the plurality of controllable current paths constructed to accommodate a selected amount of current when activated;

a voltage sensing circuit coupled to receive a control voltage and activating ones of the controllable current paths as a function of changes in magnitude of the control voltage; and a second semiconductor device coupled to receive the output voltage from the first device and providing an output current having a selected relationship to the magnitude of the output voltage received from the first device.

9. The current source of claim 8 wherein the first and second semiconductor devices are field effect transistors, and further wherein the first semiconductor device is in a diode-connected configuration.

10. The current source of claim 8 wherein the source of current is a current mirror.

11. The current source of claim 8 wherein each of the plurality of controllable current paths include field effect transistors.

12. The current source of claim 11 wherein the plurality of controllable current paths comprise a diode-connected metal oxide semiconductor transistor;

a second metal oxide semiconductor transistor connected in series with the diode-connected metal oxide semiconductor transistor, and having a control gate which is coupled to be controlled by the control circuit.

13. The current source of claim 8 wherein the voltage sensing circuit includes a plurality of diode-connected field effect transistors connected in series to form a ladder, with one end of the ladder coupled to the supply voltage; and further wherein junctions between ones of the diode-connected field effect transistors supply control voltages which control the plurality of controllable current paths.

14. A current source providing an output current and powered from a supply voltage comprising an output device providing the output current at an output terminal and having a control terminal, wherein the magnitude of the output current is controlled as a function of a voltage applied to the control terminal;

a source of current having an output coupled to the control terminal of the output device, wherein the source of current provides a predetermined amount of current;

a first semiconductor device coupled to receive current from the output of the source of current and producing a voltage at the output of the source of current the magnitude of which has a selected relationship to the magnitude of current received from the source of current;

a plurality of controllable current paths connected to receive current from the output of the source of current, each of the plurality of controllable current paths constructed to accommodate a selected amount of current when activated;

a voltage sensing circuit coupled to the supply voltage and activating ones of the controllable current paths as a function of changes in magnitude of the supply voltage, so that a voltage level at the output of the source of current controls the output current flow through the output device.

15. The current source of claim 14 wherein the source of current is a current mirror.

16. The current source of claim 14 wherein each of the plurality of controllable current paths includes field effect transistors.

17. The current source of claim 16 wherein the plurality of controllable current paths comprise a diode-connected metal oxide semiconductor transistor;

a second metal oxide semiconductor transistor connected in series with the diode-connected metal oxide semiconductor transistor, and having a control gate which is coupled to be controlled by the control circuit.

18. The current source of claim 14 wherein the voltage sensing circuit includes a plurality of diode-connected field effect transistors connected in series to form a ladder, with one end of the ladder coupled to the supply voltage; and further wherein junctions between ones of the diode-connected field effect transistors supply control voltages which control the plurality of controllable current paths.

* * * * *